United States Patent
Gerlach et al.

(10) Patent No.: US 8,164,059 B2
(45) Date of Patent: Apr. 24, 2012

(54) IN-CHAMBER ELECTRON DETECTOR

(75) Inventors: Robert Gerlach, Eagle Mountain, UT (US); Mostafa Maazouz, Hillsboro, OR (US); Trevor Dingle, Copper Beech Wood End (GB); Mark Utlaut, Scappoose, OR (US); James McGinn, Portland, OR (US)

(73) Assignee: FEI Company, Hillsboro, OR (US)

( * ) Notice: Subject to any disclaimer, the term of this patent is extended or adjusted under 35 U.S.C. 154(b) by 88 days.

(21) Appl. No.: 12/141,723

(22) Filed: Jun. 18, 2008

(65) Prior Publication Data
US 2008/0308742 A1 Dec. 18, 2008

Related U.S. Application Data

(60) Provisional application No. 60/944,792, filed on Jun. 18, 2007.

(51) Int. Cl.
*H01J 37/244* (2006.01)
*H01J 37/256* (2006.01)
*H01J 37/28* (2006.01)

(52) U.S. Cl. .................. 250/310; 250/309; 250/397
(58) Field of Classification Search .................. 250/310, 250/397, 309
See application file for complete search history.

(56) References Cited

U.S. PATENT DOCUMENTS

| | | | |
|---|---|---|---|
| 3,474,245 A * | 10/1969 | Kimura et al. .............. 250/310 |
| 3,538,328 A | 11/1970 | Strausser | |
| 3,783,281 A | 1/1974 | Crewe | |
| 3,894,233 A | 7/1975 | Tamura et al. | |
| 4,101,771 A | 7/1978 | Hofer et al. | |
| 4,320,295 A | 3/1982 | Eloy | |
| 4,322,629 A | 3/1982 | Eloy et al. | |
| 4,694,170 A * | 9/1987 | Slodzian et al. ............. 250/310 |
| 5,065,029 A * | 11/1991 | Krivanek .................. 250/441.11 |
| 5,463,218 A | 10/1995 | Holle | |
| 5,635,720 A * | 6/1997 | Mooney et al. ............. 250/397 |
| 5,656,811 A * | 8/1997 | Itoh et al. .................. 250/310 |
| 5,717,206 A | 2/1998 | Watanabe et al. | |
| 5,866,901 A | 2/1999 | Penn et al. | |
| 5,990,483 A | 11/1999 | Shariv et al. | |
| 6,051,831 A | 4/2000 | Koster | |
| 6,194,719 B1 * | 2/2001 | Mooney et al. ............. 250/311 |
| 6,303,932 B1 | 10/2001 | Hamamura et al. | |
| 6,781,125 B2 * | 8/2004 | Tokuda et al. ............. 250/307 |

(Continued)

FOREIGN PATENT DOCUMENTS

| EP | 1501115 | 1/2005 |
|---|---|---|
| JP | 063071680 | 4/1988 |
| JP | 01137547 | 5/1989 |
| JP | 06187940 | 8/1994 |
| JP | 07142022 | 6/1995 |

OTHER PUBLICATIONS

Everhart et al., "Wide-band detector for micro-microampere low-energy electron currents", Journal of Scientific Instruments, vol. 37, Jul. 1960, pp. 246-248.*

(Continued)

*Primary Examiner* — Jack Berman
(74) *Attorney, Agent, or Firm* — Scheinberg & Griner, LLP; Michael O. Scheinberg

(57) ABSTRACT

A secondary particle detector 302 for a charged particle beam system 300 includes a scintillator 304 and a transducer 312, such as a photomultiplier tube, positioned within a vacuum chamber 107. Unlike prior art Everhart-Thornley detectors, the photomultiplier is positioned within the vacuum chamber, which improves detection by eliminating optical couplings and provides flexibility in positioning the detector.

27 Claims, 10 Drawing Sheets

U.S. PATENT DOCUMENTS

| | | | |
|---|---|---|---|
| 6,828,729 B1 | 12/2004 | Owens et al. | |
| 6,861,650 B2 * | 3/2005 | Kondo et al. | 250/310 |
| 6,906,318 B2 | 6/2005 | Bateman et al. | |
| 7,009,187 B2 * | 3/2006 | Gerlach et al. | 250/397 |
| 2004/0061054 A1 | 4/2004 | Kondo et al. | |
| 2004/0188610 A1 * | 9/2004 | Hirose | 250/310 |
| 2006/0289748 A1 | 12/2006 | Schon et al. | |

OTHER PUBLICATIONS

Pramann, Axel, "A New Scintillation-Type Time-Of-Flight Anion Detector," Review of Scientific Instruments, Aug. 2001, pp. 3475-3476, vol. 72, No. 8.

Daly, N.R., "Scintillation Type Mass Spectrometer Ion Detector," The Review of Scientific Instruments, Mar. 1960, pp. 264-267, vol. 31, No. 3.

El-Mul, "Elion Dual Detection Platform Video Tour: Elion Dual Detection Platform," Website, www.el-mul.com, www.el-mul.com/inr.asp?=255&sid=2676&pid=2676, Publication date unknown, Retrieved Apr. 23, 2007, 2 Pages.

Amptektron, "A Complete CEM Detector System for Vacuum Use," Website, www.amptektron.com, http://www.amptek.com/md501.html; Publication Date Unknown, Retrieved Oct. 20, 2009, 7 Pages.

* cited by examiner

US 8,164,059 B2

IN-CHAMBER ELECTRON DETECTOR

TECHNICAL FIELD OF THE INVENTION

The present invention relates to particle detectors for charged particle beam systems.

BACKGROUND OF THE INVENTION

Charged particles beam systems, such as electron beam systems and ion beam systems, can form images by detecting secondary or backscattered electrons or ions that are emitted when the primary beam impacts the work piece surface. For many years, scanning electron microscopes and focused ion beam systems have used a scintillator-photomultiplier detector, known as an Everhart-Thornley detector or simply an "ET detector," or ETD to detect secondary electrons. Other types of electron detectors include a channel detection electron multiplier, (sometimes referred to as a continuous dynode electron multiplier or CDEM) and a multichannel plate (MCP).

FIG. 1A shows schematically a typical prior art dual beam system 100 having an electron column 102 and a focused ion beam column 104 for operating on a sample 105 in a vacuum chamber 107 and using a conventional ET detector 140. When primary electron beam 120 impacts sample 105, secondary electrons 142 are emitted and are accelerated by an applied voltage toward a grid 106 and impact a scintillator 108, which is composed of a material, (such as a phosphor, a light-emitting plastic or a garnet oxide) that emits light (called cathodoluminescence) when impacted by charged particles such as electrons 142. The light is typically conducted by a rigid light pipe 110, a solid plastic or glass rod passing through a sealed port in the specimen chamber, through a transparent window 112 in the vacuum chamber to a photomultiplier tube (PMT) 114 that is positioned outside the vacuum chamber. In PMT 114, the light causes the emission of electrons, which impacts dynodes in the photomultiplier tube, which cause the emission of additional electrons.

The additional electrons impact the dynodes of PM tube 110, creating a cascade of electrons that results in an amplified signal. The electrons are collected by an electrode at the end of the PM tube. The electrons constitute an electric current which is conducted by a conductor 130 to imaging circuitry 132. The magnitude of the current is used to determine the brightness of a point on the image corresponding to the point on the work piece where the beam is impacting. As the beam scans the work piece, the image is built up, point by point.

FIG. 1B shows a schematic drawing of the vacuum chamber of the prior art SEM of FIG. 1A. It shows the final lens 102, the so-named objective lens of an electron column and a portion of an ET detector 160 that combines a through-the-lens secondary electron detector 162 and a non-through-the-lens secondary electron detector 164. The through-the-lens secondary electron detector converts electrons to photons inside the structure of the objective lens and transports the photons via a light guide 162 to a PM tube positioned outside the vacuum chamber (not shown). The non-through-the-lens secondary electron detector shows a grid 164 sucking the secondary electrons to a fluorescent screen within housing 166, where the electrons are converted to photons, which in turn are guided to the PM tube outside the vacuum chamber.

FIG. 2A shows schematically a dual beam system similar to that of FIG. 1A, but using a CDEM detector 206 having an input grid 202 and spiral channels (not shown) that amplify the electron signal when its walls are impacted by electrons by producing additional electrons.

FIG. 2B shows a schematic drawing of the vacuum chamber of the prior art dual beam system of FIG. 2A. It shows a CDEM 206 by the objective lens 252 of an electron column and a gas injection system 254 near CDEM 206.

In some dual beam systems, there are a multitude of accessories competing for space in sample chamber 107 near the point where the beam 120 impacts the work piece 105. Accessories may include, for example, one or more gas injection nozzles 254, one or more micromanipulators (not shown), a charge neutralization electron flood gun, and different types of detectors, such as a backscattered electron detector (not shown), x-ray detectors, and a secondary electron detector. Ion column 104 and electron column 102 are preferably positioned close to the work piece to enhance resolution.

When an electron or ion in a primary beam impacts a work piece surface, the emitted secondary electrons are distributed substantially equally in all directions throughout a hemisphere over the work piece. The further the scintillator is from the work piece, the smaller the fraction of the emitted electrons that will impact the scintillator. A positive electric charge on the detector relative to the sample increases the number of secondary electrons that impact the scintillator, but it is thought that only about fifteen to twenty percent of the secondary electrons emitted from the sample actually reach a conventional ET detector.

The secondary electron detector is typically positioned with the scintillator within the sample chamber 107, sufficiently far from the work piece 105 to allow the charged particle beam columns and other accessories to fit near the sample or work piece. Because the light tube 110 must lead from the scintillator to the window 112 in the vacuum chamber, the scintillator cannot be repositioned within the chamber without redesigning the light tube and/or changing the location of the window in the vacuum chamber. Thus, users of dual beam systems have limited flexibility in adapting their systems for new accessories and new applications. Moreover, at each interface in the light path, some of the light is lost. Conducting the light to the window, through the window, and then into the PM tube results in significant loss of light.

CDEMs and MCPs amplify the electron signal directly, without converting the signal to light and conducting the light outside of the vacuum chamber. Thus, a CDEM or MCP can be positioned entirely within a sample vacuum chamber. CDEMs and MCPs use an activated surface to amplify the electron signal. This surface degrades under charged particle stimulation, particularly if beam-activated chemicals, which are used in many deposition and etching processes, are introduced into the chamber. The surface also is prone to degradation when the chamber is vented for sample exchange.

In some applications, CDEMs can only function for a month or two before they need to be replaced. Thus, CDEMs are not efficient in many applications, in which many chemicals are used. CDEMs also have lower resolution than ETDs Thus, the CDEM is typically placed in a good position for signal collection, but has limited lifetime. The ETD has good lifetime but is mounted in the wrong place for good signal collection and loses signal as the light moves through coupled components to outside the vacuum chamber.

Ion-to-electron converters can be used with ETDs to detect ions and electrons replace CDEM or MCP and can eliminate the lifetime issues with those detectors, but with a PMT outside the vacuum chamber, still require complex, rigid assemblies with vacuum feedthrough ports in the right locations on the chamber wall relative to the desired placed for the detector. This detector has to be re-engineered in a major way for every different system.

Designer and users of dual beam instruments are acutely aware of the congested space close to the sample due to the presence of an electron column, ion column, gas injectors, sample probes, other detectors, such as backscatter electron detectors (BSD), x-ray detectors for energy dispersive spectroscopy (EDX), electron backscatter diffraction detectors (EBSD), and cathodoluminescence (CL) detectors. The inflexibility of positioning the ETD makes it difficult to reconfigure the instrument to move other devices close to the sample for particular applications.

The market need for both flexibility and long life have been known, but was not solved. The present invention solves the limited lifetime issue of the CDEM/MCP while retaining the flexibility of the mounting arrangement.

SUMMARY OF THE INVENTION

An object of the invention is to provide an improved secondary particle detector.

This invention provides an improved detector using a scintillator and a transducer, such as photomultiplier tube, a photodiode or a phototransistor, in which the transducer, as well as the scintillator, is positioned entirely within the sample vacuum chamber. The transducer converts the light from the scintillator to an electrical signal. By positioning the transducer within the vacuum chamber, the designer is not constrained in positioning the scintillator by a light pipe that is required in the prior art to lead the light from the vacuum chamber, and the detector can be positioned to provide a stronger secondary electron signal that prior art detectors. Eliminating the optical components required to lead the light out of the vacuum chamber eliminates a source of signal loss.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which.

DETAILED DESCRIPTION OF PREFERRED EMBODIMENTS

Figure 3:
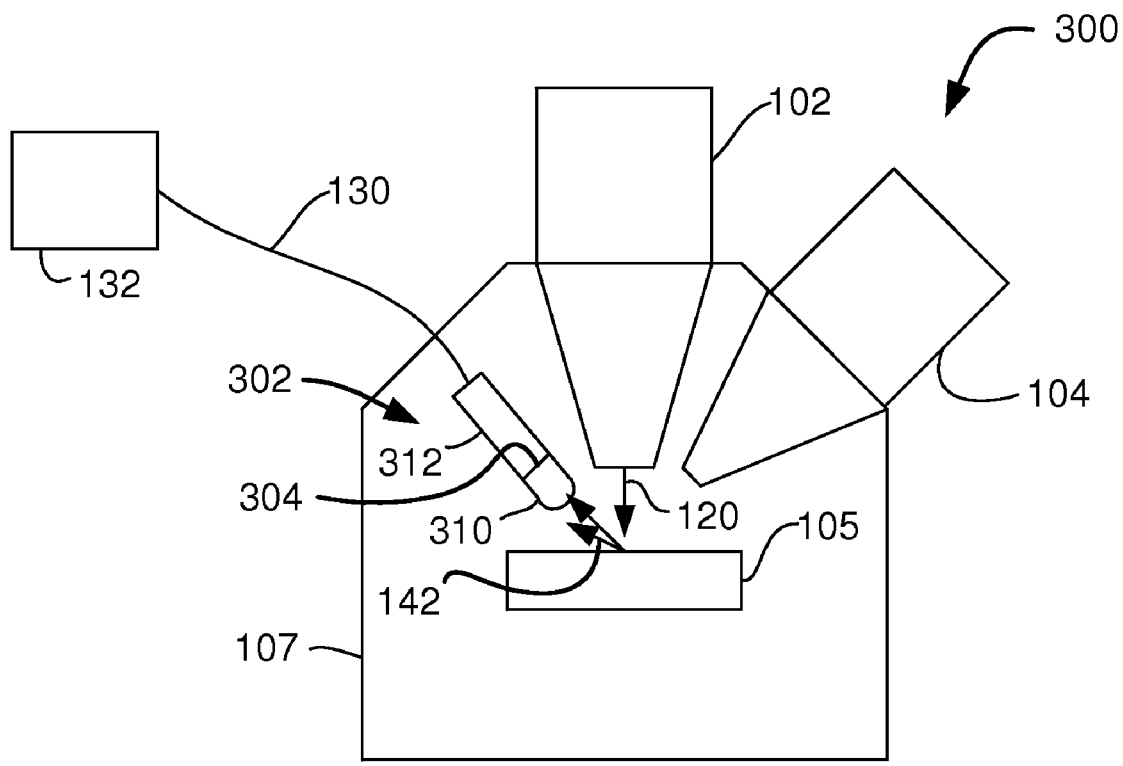
FIG. 3 shows a preferred embodiment of a charged particle beam system using an in-vacuum chamber secondary electron detector.

FIG. 3 shows a dual beam system 300 using an in-chamber ET (ICE) detector 302. Detector 302 includes a scintillator 304, typically of a phosphor material, and a transducer such as a compact photomultiplier tube 312, and a conductive grid 310 for attracting charged particles. A suitable compact photomultiplier tube is available, for example, from Hamamatsu Photonic KK, Shizuoka-ken, Japan. The photomultiplier tube is preferably less than 115 mm long, more preferably less than 75 mm, and even more preferably less than 55 mm long, and most preferably less than or about 30 mm long. An electrical lead 130 conducts the output of PM tube 312 to imaging circuitry 132 outside of the vacuum chamber 107. Because the PM tube 312 is within the vacuum chamber, no light tube is required to lead the light to a PM located positioned outside of the vacuum chamber.

It is noted that instead of a PM tube, other types of photon-to-current converters can be used, such as photodiodes or phototransistors.

The ICE detector is similar in physical size to the CDEM but is of the ETD type. It has only a single very short light guide that goes directly to a PMT located in the vacuum chamber close to the scintillator. The light guide is preferably greater than 5 mm long to prevent arcing and preferably less than 50 mm long, and even more preferably less than 25 mm long, and preferably about 10 mm long. The entire ICE detector is preferably less than 120 mm, more preferably less than 80 mm and even more preferably less than 60 mm or less than 30 mm in length. The signal-to-noise ratio is significantly enhanced over the current EDT since there is no signal loss and/or noise due to mating light guides as well as an over all length decrease. There is also a significant space savings in the immediate area of the pole piece. Another significant problem for the CDEM is lifetime (3 week to 6 month time to failure) and gas contamination induced failure. This issue has led many people to either simply not use the CDEM or remove it from their system. The ICE detector is extremely robust to gas contamination as well as exhibiting a lifetime greater than two years. The ICE detector is also much more efficient relative to the CDEM due to the fact that it can operate at about a 2× higher bias voltage and can be easily placed in various "better" locations. It is also similar to the CDEM in that it can also detect secondary ions when used with an ion-to-electron converter.

Figure 1A:
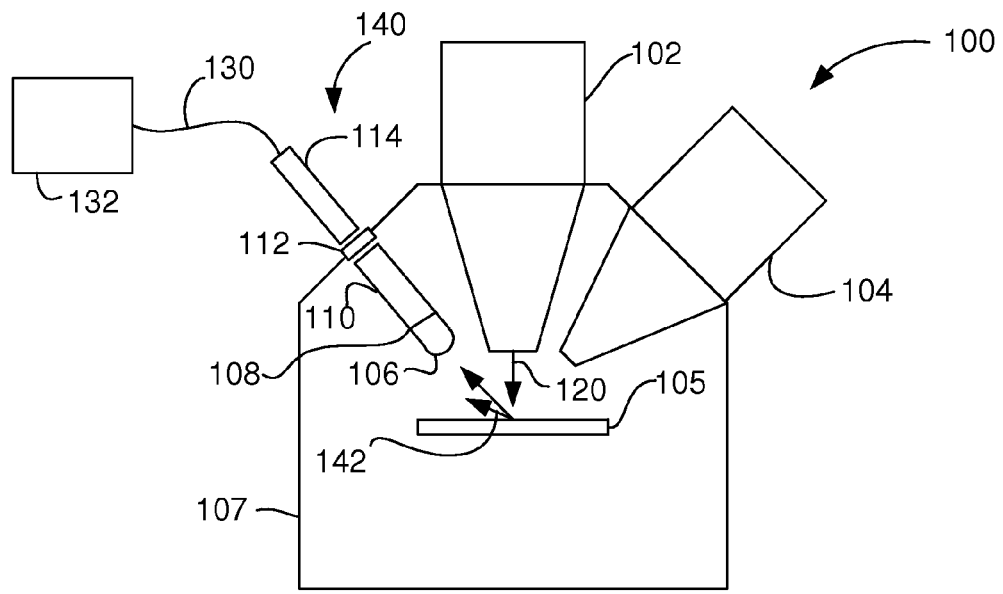
FIG. 1A shows schematically a prior art charged particle beam system that uses an Everhart-Thornley detector with a photomultiplier tube positioned outside the sample vacuum chamber.
Figure 2A:
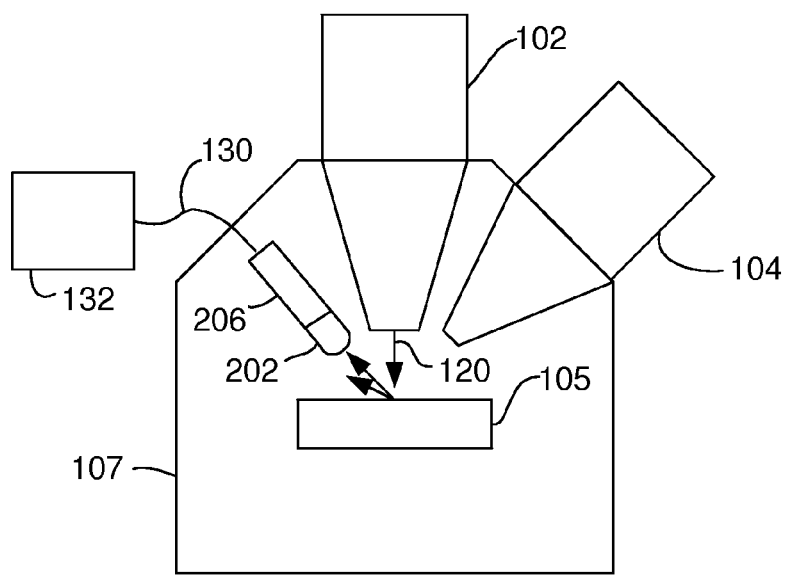
FIG. 2A shows schematically a prior art charged particle beam including a CDEM detector.
Figure 1B:
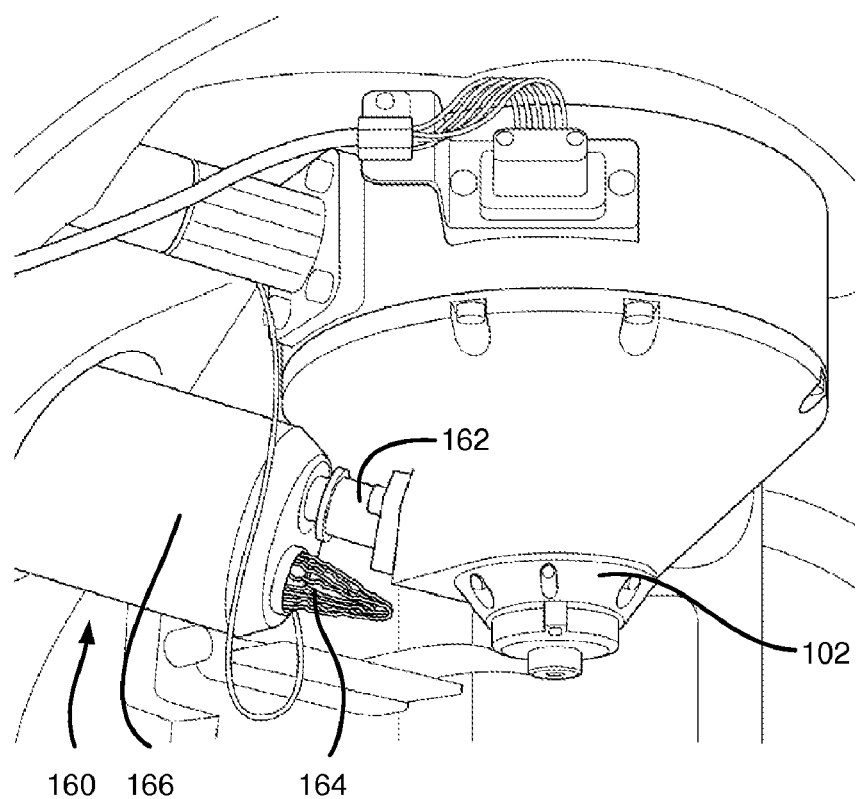
FIG. 1B shows a schematic drawing of a prior art charged particle beam system using an ET detector.
Figure 2B:
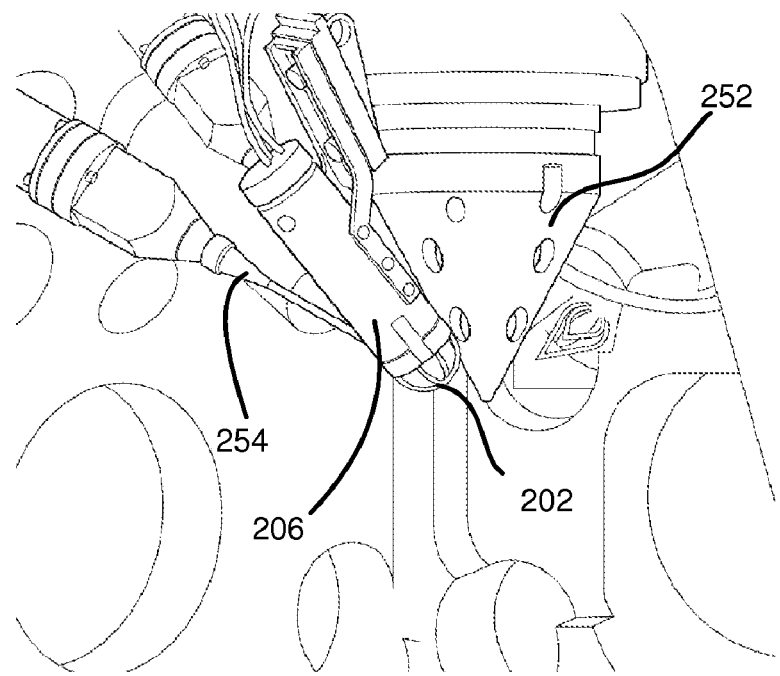
FIG. 2B shows a schematic drawing of a prior art charged particle beam system using a CDEM detector.

Because the light is not conducted to outside the vacuum chamber, the interface between light tubes is eliminated, thereby eliminating a source of light loss and improving efficiency of the detector. Also, eliminating the light tube leading outside the chamber and the compact size of detector 302 allows the detector to be positioned in such a manner as to collect a greater fraction of the secondary electrons. Applicants have measured signals that are more that three to five times the signal received by a prior art detector such as that shown in FIG. 1. Increased signal means that the charged particle beam can be scanned faster during image acquisition, causing reduced damage to the work piece. A stronger signal also increases the signal to noise ratio, thereby producing a better image.

Figure 4:
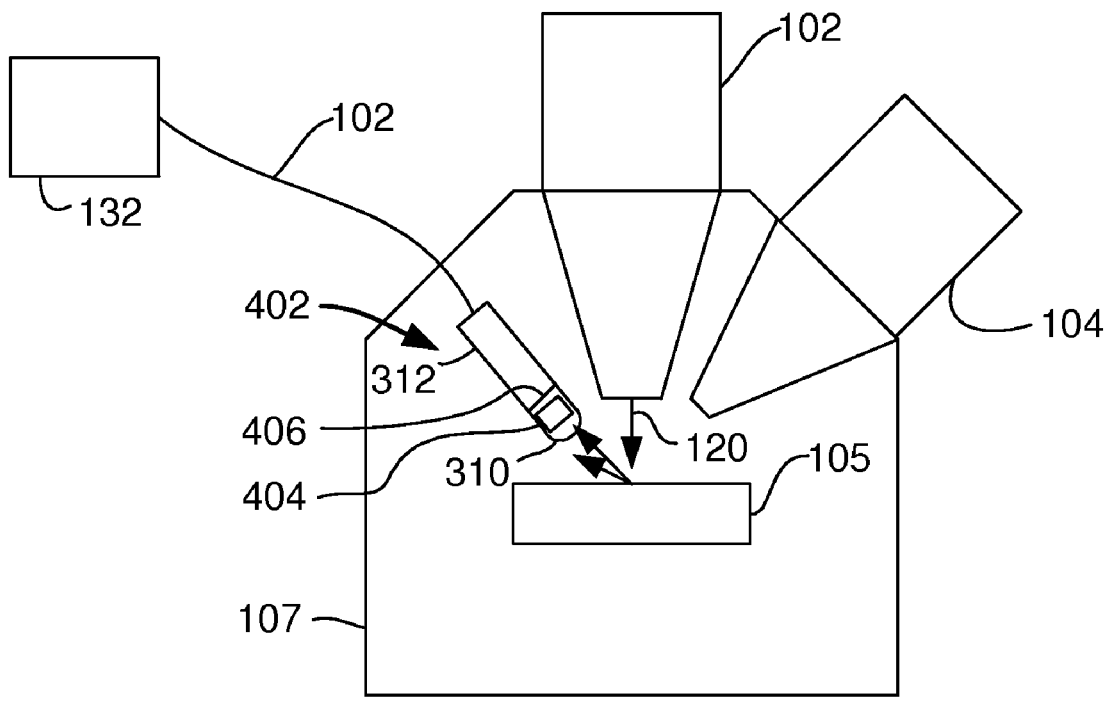
FIG. 4 shows a preferred embodiment of a charged particle beam system using an in-vacuum chamber ion and secondary electron detector.

FIG. 4 shows a detector 402 similar to that of FIG. 3, but having an ion-to-electron convert 404, thereby allowing the detector 402 to also detect ions. Such an ion-to-electron converter is described in U.S. Pat. No. 7,009,187 to Gerlach et al. for "Particle Detector Suitable for Detecting Ions and Electrons," which is assigned to the assignee of the present application and which is hereby incorporated by reference. Ion-to-electron converter 404 preferably can be configured to pass electrons without interference or can be configured to collect ions, cause them to impact on a surface to generate electrons, and then the electrons impact on a scintillator 406. The light from the scintillator is detected in the PM tube 312, in the same manner as when electrons emitted from the sample 105 are being detected. Ion-to-electron converter 404 can be a "venetian blind" style converter or a cylindrical converter, as described in U.S. Pat. No. 7,009,187.

Figure 5:
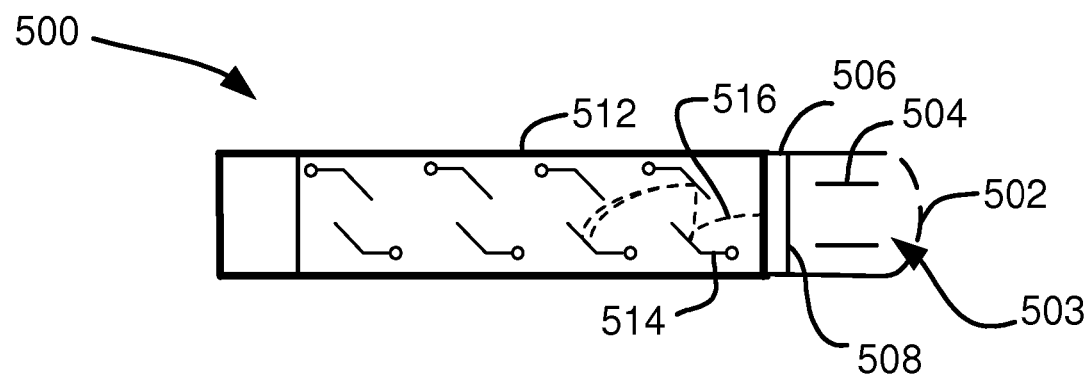
FIG. 5 shows an enlarged view of the secondary ion and electron detector of FIG. 4.

FIG. 5 shows a portion of detector 500 having a grid 502 to which a voltage is applied to selectively attract ions or electrons. The geometry of grid 502 is optimized for attracting charged particles and for transporting charged particles to the scintillator. An ion-to-electron converter 503 includes a cylinder 504 that can be electrically configured to attract ions or to allow electrons to pass transparently through ion-to-electron converter 503. When cylindrical 504 is biased to attract ions, the ions impinge on the surface, which emits electrons. Scintillator 508 emits light when impacted by electrons, either electrons that come directly from work piece 105 or from plates 504 in response to ion impacts. A short light tube 506 leads the light into PM tube 512, in which electrons 516 strike dynodes 514 to amplify the signal.

Figure 6:
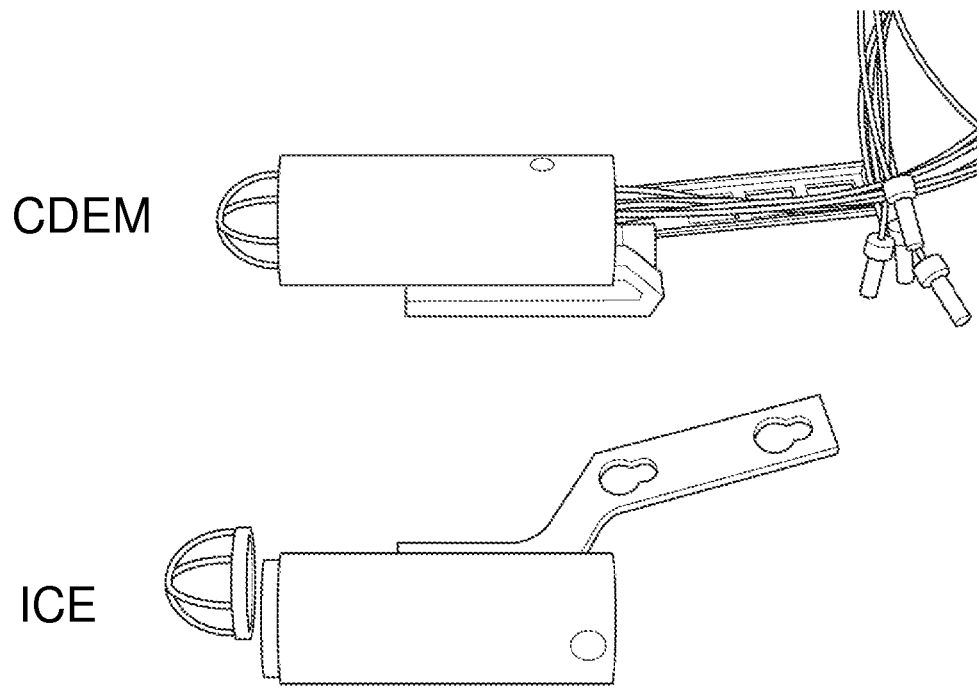
FIG. 6 shows the relative sizes of a preferred in-vacuum electron detector and a prior art CDEM detector.

FIG. 6 shows that a preferred in-chamber electron detector of the present invention using a compact PM tube is about the same size as a prior art CDEM, thereby allowing it to be positioned near the sample, but providing a much longer useful life than the CDEM in many applications.

Figure 7:
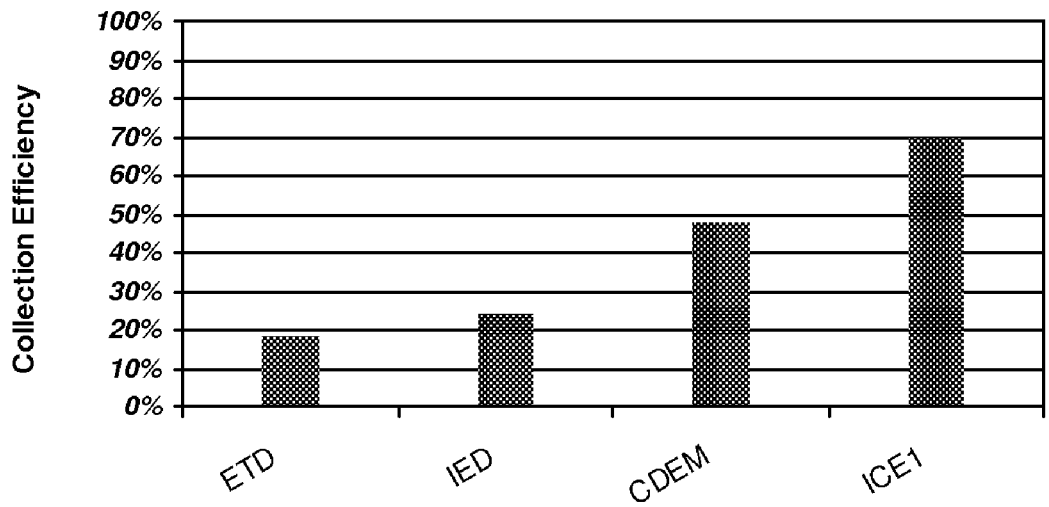
FIG. 7 is a graph showing the relative collection efficiencies of secondary electrons for conventional ET detectors, ion and electron detectors, CDEM and an in-vacuum electron detector in accordance with the invention mounted in a particular charged particle beam system in a first configuration.
Figure 8:
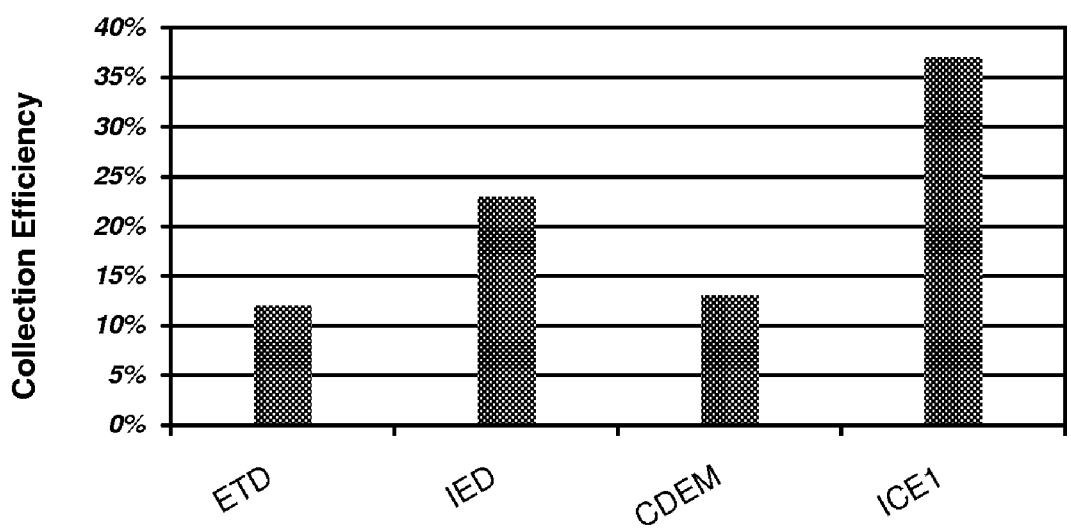
FIG. 8 is a graph showing the relative collection efficiencies of secondary electrons for conventional ET detectors, ion and electron detectors, CDEM and an in-vacuum electron detector in accordance with the invention mounted in a particular charged particle beam system in a second, horizontal, configuration.
Figure 9:
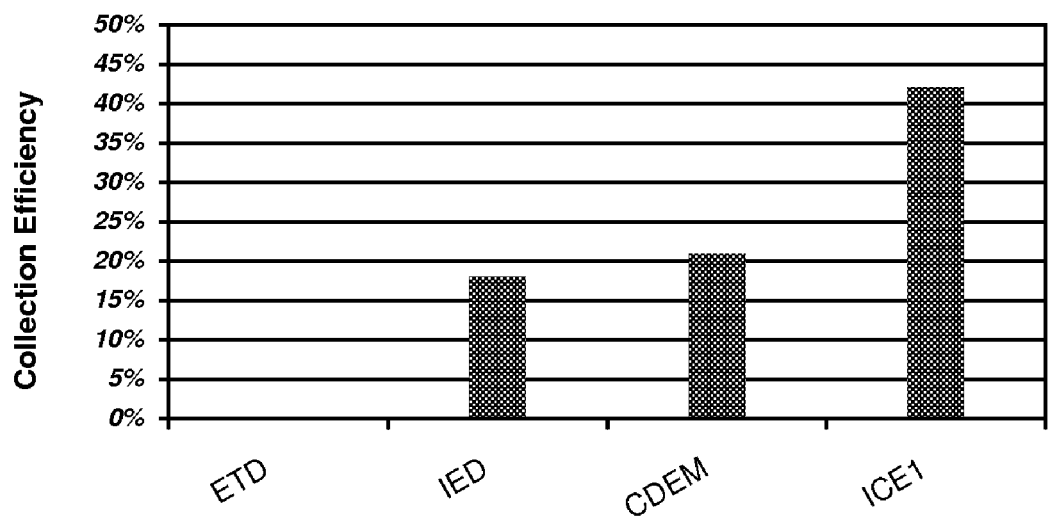
FIG. 9 is a graph showing the relative collection efficiencies of ions of an ion and electron detectors, CDEM, and an in-vacuum electron detector in accordance with the invention.

FIGS. 7, 8, and 9 show collection efficiencies of different detectors, including a conventional ETD, an ion-to-electron converter detector, a CDEM, and an in-chamber electron detector of the present invention in two different charged particle beam systems. FIG. 7 shows collection efficiencies for secondary electrons with the detectors oriented at 52 degrees. FIG. 8 shows collection efficiencies for secondary electrons for horizontally oriented detectors. FIG. 9 shows collection efficiencies for secondary ions with the detectors oriented at 52 degrees. A CDEM can be used to detect ions, as well as electrons, although using a CDEM as an ion detector can shorten its useful life.

Figure 10A:
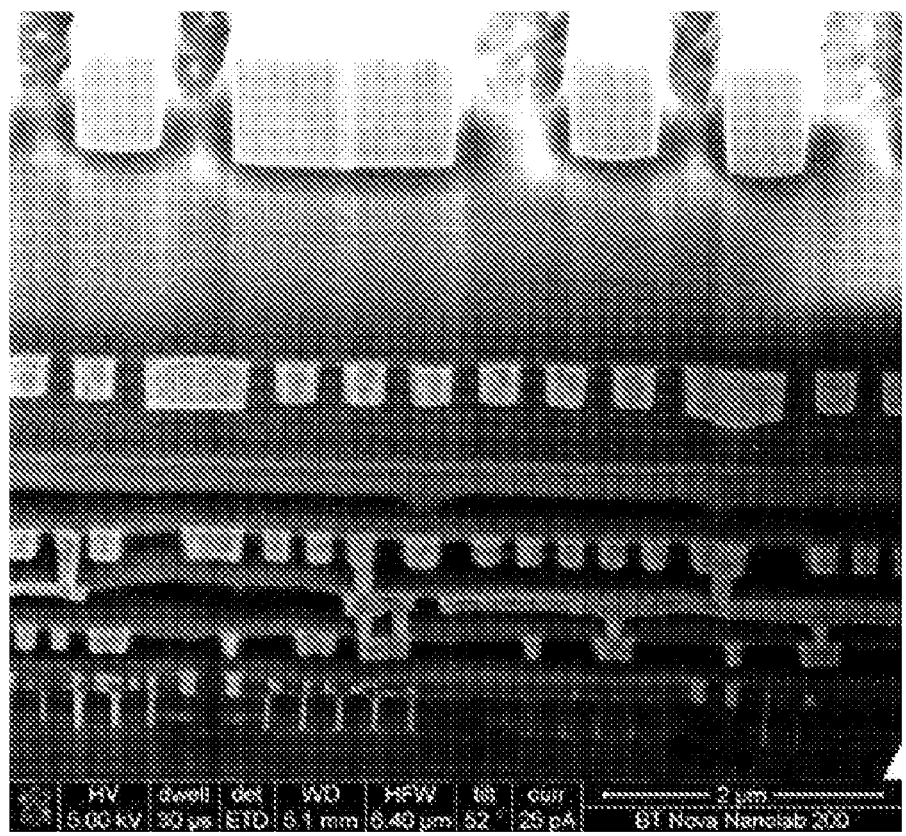
FIG. 10A shows an image formed using a CDEM detector and FIG. 10B shows the same image formed using a detector.
Figure 10B:
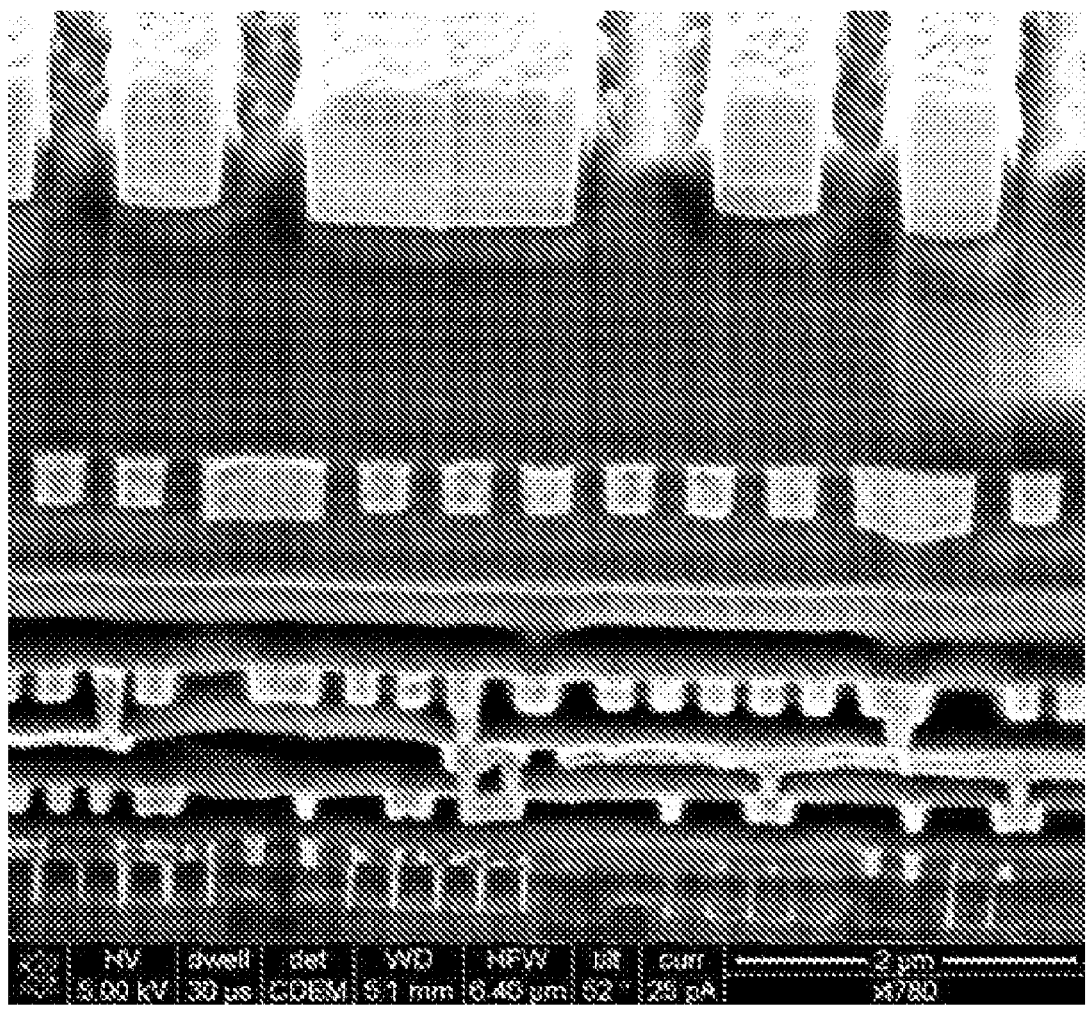

FIGS. 10A and 10B show images of circuits that are formed using a CDEM detector and an ICE detector of the present invention, respectively. Note the lack of "shadowing" using the ICE detector. This result is due to the ability to position the ICE detector in such a way as to avoid shadowing.

Figure 11A:
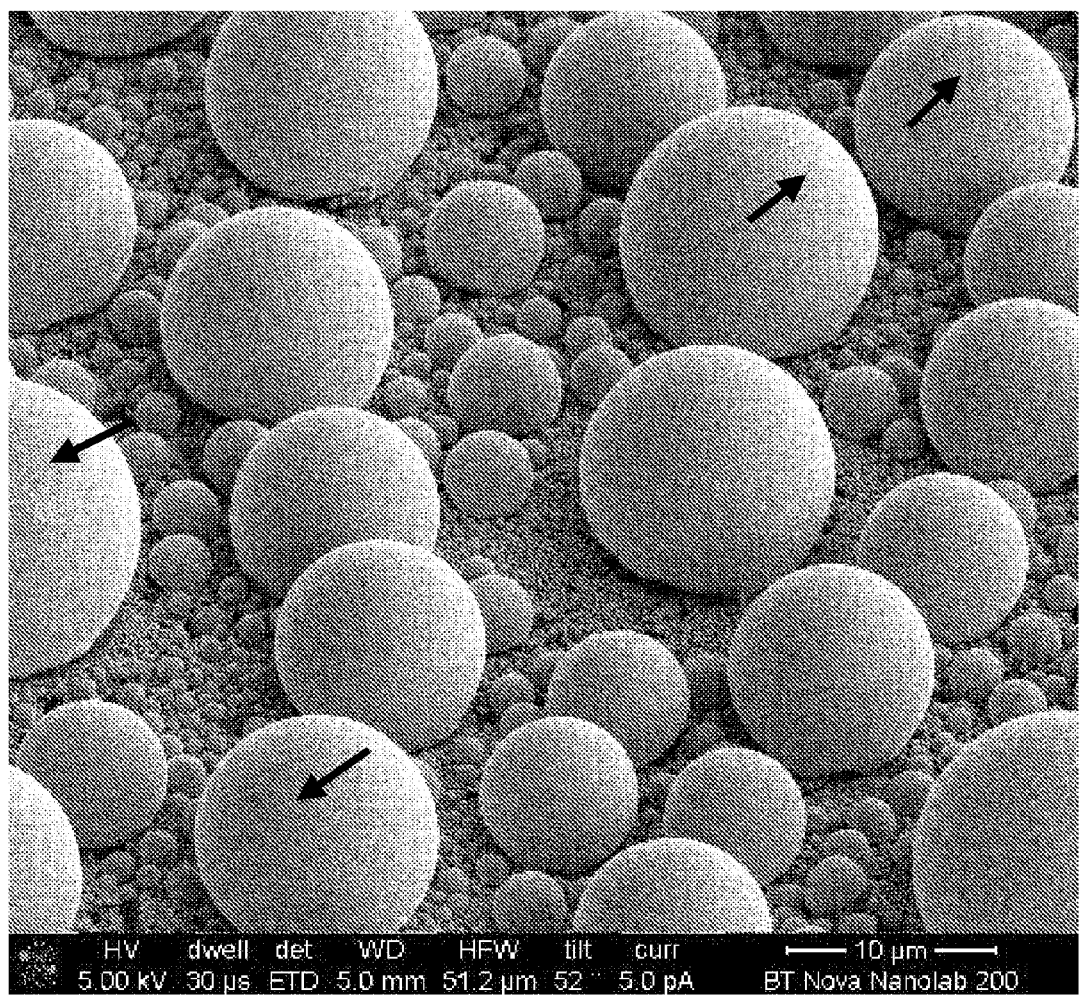
FIG. 11A shows an image formed using a CDEM detector and FIG. 11B shows the same image formed using a detector.
Figure 11B:
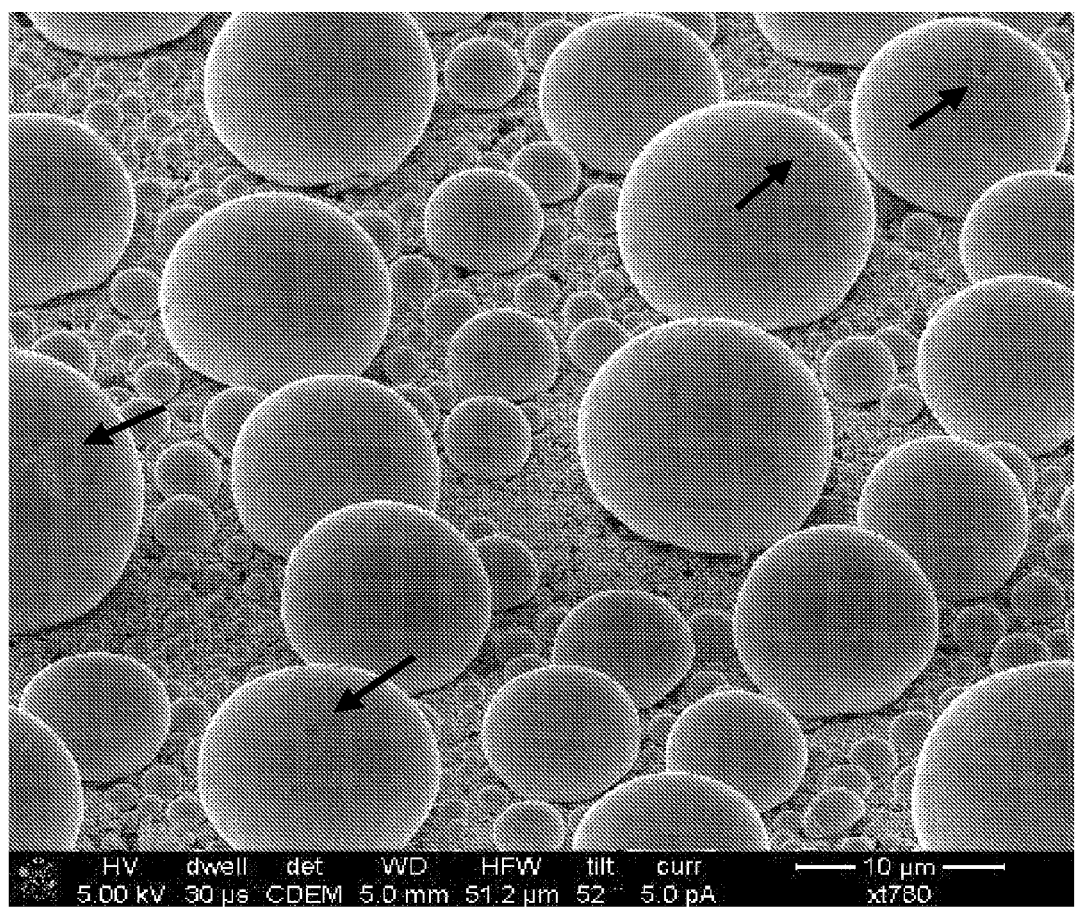

FIGS. 11A and 11B show comparison of the typical CDEM detector image (FIG. 11A) and the ICE detector image (FIG. 11B). Note the obvious detail visible in the ICE image as well as the "grain smoothness." All other imaging parameters are identical, the only change being the detector used to "see" the object.

Positioning the PM tube within the vacuum chamber provides the following advantages:
Reduction of signal losses in the light path between the scintillator and the PMT due to the reduction of optical coupling stages and shortening or elimination of the light guide
Flexibility of mounting due to the removal of the need for the rigid light guide to the PMT through a vacuum sealed window. The vacuum wall interface is only for electrical connections. The system can thus be readily moved to reconfigure the charged particle beam instrument, for example, to rearrange accessories so that different accessories can be made available for different applications.

The ICE detector currently has at least three preferred embodiments: 1) one embodiment has secondary electron and secondary ion detection capabilities by using an ion-to-electron converter; 2) one has secondary electron capability only, and 3) one has through-the-lens secondary electron detection capability.

The ICE detector has significantly increased SE collection efficiency, as well as increasing the life time from 1-6 months (CDEM) to over two years (ICE). ICE capability is particularly useful in circuit edit (CE) applications to image (using SE's) during ion milling. CE processes are such that even now end pointing in small, medium aspect ratio vias (e.g. less than 90 nm deep), is almost impossible. The ICE detector could very well be a key enabler to CE going forward.

Ion-to-Electron Detector

Figure 12:
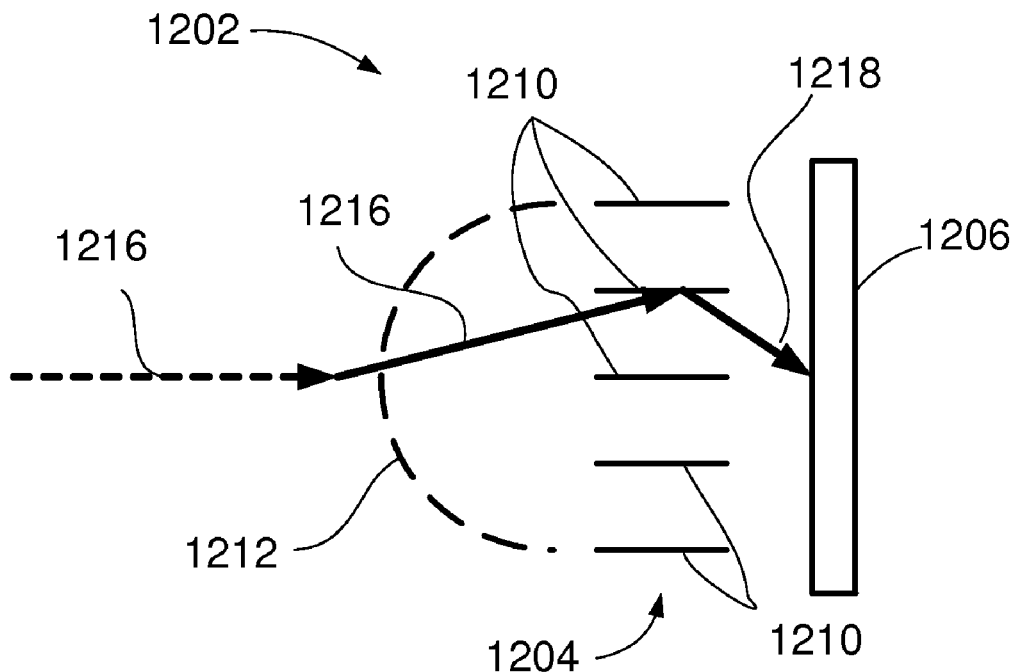
FIG. 12 shows an ion-to-electron detector configured to detect ions from U.S. Pat. No. 7,009,187.
Figure 13:
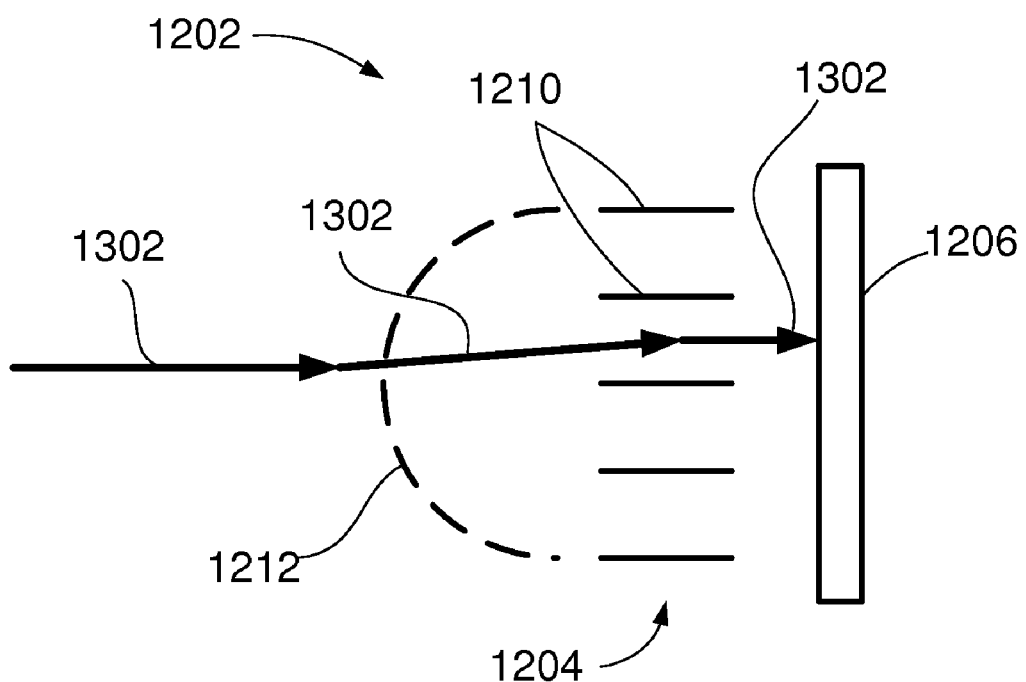
FIG. 13 shows an ion-to-electron detector configured to detect electrons from U.S. Pat. No. 7,009,187.

FIGS. 12 and 13 described the ion-to-electron converter as described in U.S. Pat. No. 7,009,187. In the embodiment shown in FIG. 12, a particle detector 1202 uses a "Venetian blind" ion-to-electron converter 1204 in front of a conventional scintillator detector 1206. A preferred embodiment uses a cylindrical converter instead of the Venetian blind. Ion-to-electron converter 1204 includes multiple converter plates 1210, preferably parallel to each other, placed between a hemispherical input grid 1212 and the scintillator detector 1206. In positive ion collection mode, the input grid is negatively biased, preferably to about −250 V relative to a FIB target to attract low energy positive ions generated at the sample by the FIB.

The converter plates 1210 are preferably maintained at an electrical potential of about −2000 V relative to the FIB target. This potential attracts positive ions 1216 to the plates and accelerates them to about 2000 eV as they strike the converter plates 1210. The ions striking the plates 1210 cause electrons 1218 to be emitted from the converter plates 1210. The converter plates 1210 are preferably constructed from a material, such as a metal oxide, that efficiently generates secondary electrons when struck by ions. In one embodiment, the plates are made of aluminum, which readily oxidizes to produce a thin surface layer of aluminum oxide. In another embodiment, the plates are constructed of a stainless steel. An electrical potential of about +10,000 V is applied to the front of the scintillator detector 1206 to attract electrons 1218 that are generated as the ions strike plates 1210. Electrons 1218 striking the scintillator disk are converted to photons and detected in a conventional manner.

FIG. 13 shows particle detector 1202 of FIG. 12 operated in an electron detection mode. In the electron detection mode, a positive potential of about 250 V is applied to input screen 1212, a positive potential of about 500 V is applied to plates 1210, and a positive potential of about 10,000 V is applied to scintillator detector 1206. Electrons 1302 are accelerated by the input grid 1212 and then the converter plates 1210. Although some electrons strike converter plates 1210, other electrons pass through the converter plates and strike the scintillator directly.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A charged particle beam system, comprising:
   a source of charged particles;
   a focusing column for forming a charged particle beam from the charged particles emitted by the charged particle beam source;
   a sample vacuum chamber containing a sample stage for holding a sample to which the charged particle beam is directed;
   a secondary particle detector positioned off the optical axis within the vacuum chamber, the detector including:
   a conductive grid providing an electric field for attracting secondary particles to the detector;
   a scintillator for emitting light when impacted by a secondary electron, the scintillator positioned above a plane defined by the sample surface and
   a photomultiplier tube for detecting the light emitted by the scintillator and converting the light to an electric current;
   characterized in that the scintillator and photomultiplier tube are all positioned within the sample vacuum chamber.

2. The charged particle beam system of claim 1 further comprising a second source of charged particles and a second focusing column for forming a charged particle beam from the charged particles emitted by the second charged particle beam source.

3. The charged particle beam system of claim 1 in which the position of the secondary particle detector is adjustable within the vacuum chamber to improve the collection of secondary particles.

4. The charged particle beam system of claim 1 in which the secondary particle detector includes an ion-to-electron converter.

5. The charged particle beam system of claim 1 further comprising a light tube to conduct light from the scintillator to the photomultiplier tube.

6. The charged particle beam system of claim 5 in which the light tube is less than 25 mm long.

7. The charged particle beam system of claim 5 in which the light tube is less than 15 mm long.

8. The system of claim 5 in which the light guide comprises a rigid rod of a transparent material positioned between the scintillator and the photomultiplier tube.

9. The system of claim 5 in which the light guide comprises a solid plastic or glass rod that conducts light from the scintillator into a single photomultiplier tube.

10. The charged particle beam system of claim 1 in which the secondary particle detector is less than 120 mm long.

11. The charged particle beam system of claim 10 in which the secondary particle detector is less than 60 mm long.

12. The charged particle beam system of claim 1 further comprising an ion-to-electron converter positioned before the scintillator.

13. The charged particle beam system of claim 12 in which the ion-to-electron converter includes a cylindrical surface for converting secondary ions to electrons.

14. The system of claim 1 in which the focusing column includes an objective lens and in which the conductive grid attracts secondary electrons from the sample without the secondary electrons passing through the objective lens.

15. The charged particle beam system of claim 1 in which the scintillator comprises a phosphor.

16. The charged particle beam system of claim 1 in which the scintillator comprises a light-emitting plastic or a garnet oxide.

17. The charged particle beam system of claim 1 in which the input grid is hemispherical.

18. The charged particle beam system of claim 1 in which the center of the input grid is positioned further away from the surface of the scintillator than are the edges of the input grid.

19. A method of detecting secondary electrons, comprising:
   directing a primary charged particle beam toward a sample surface in a sample vacuum chamber;
   attracting by an electric field provided by a conductive grid charged particles emitted from the surface upon impact of the primary charged particle beam toward a material within the vacuum chamber that emits photons upon the impact of a charged particle, the material positioned above the sample plane;
   detecting the photons and converting the photons to an electric current using a photomultiplier tube, the current being proportional to the number of charged particles detected from the sample surface upon impact of the charged particle beam; and
   conducting the electric current from the vacuum chamber, characterized in that the photons are converted to an electric current within the vacuum chamber.

20. The method of claim 19 in which directing a primary charged particle beam toward a sample surface in sample vacuum chamber includes directing an ion beam or an electron beam.

21. The method of any of claims 19 further comprising conducting photons through a light tube toward the photomultiplier tube.

22. The method of any of claims 19 in which detecting and converting the photons to an electric current within the vacuum chamber includes detecting and converting the photons to an electric current within a device that is less than 15 cm long.

23. The method of any of claims 19 in which attracting charged particles emitted from the surface upon impact of the primary charged particle beam further includes attracting ions and further comprising converting the ions to electrons.

24. A secondary particle detector sufficiently compact for being positioned within the vacuum chamber of a scanning electron microscope, the detector comprising:
   a scintillator for emitting light when impacted by a secondary electron;
   a conductive grid for providing an electric field attracting secondary electrons to the scintillator;
   a photomultiplier tube for detecting the light emitted by the scintillator and converting the light to an electric current;
   a light guide for guiding light from the scintillator to the photomultiplier tube, the light guide providing a light path from the scintillator to the photomultiplier tube that is shorter than 50 mm, the secondary particle detector bring sufficiently compact for being positioned above the plane of the sample in a scanning electron microscope.

25. The secondary particle detector of claim 24 in which the light guide providing a light path from the scintillator to the photomultiplier tube that is shorter than 25 mm.

26. The secondary particle detector of claim 24 in which the light guide providing a light path from the scintillator to the photomultiplier tube that is shorter than 15 mm.

27. The secondary particle detector of claim 24 in which scintillator, photomultiplier tube, and light guide together are less than 100 mm long.

* * * * *